United States Patent
Melanson

(10) Patent No.: US 7,558,358 B1
(45) Date of Patent: Jul. 7, 2009

(54) METHOD AND APPARATUS FOR GENERATING A CLOCK SIGNAL ACCORDING TO AN IDEAL FREQUENCY RATIO

(75) Inventor: John L. Melanson, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 140 days.

(21) Appl. No.: 11/691,964

(22) Filed: Mar. 27, 2007

Related U.S. Application Data

(63) Continuation-in-part of application No. 11/082,347, filed on Mar. 17, 2005, now Pat. No. 7,474,724.

(60) Provisional application No. 60/618,303, filed on Oct. 13, 2004.

(51) Int. Cl.
*H03D 3/24* (2006.01)

(52) U.S. Cl. ........................ 375/376; 375/354

(58) Field of Classification Search ............... 375/376, 375/354
See application file for complete search history.

(56) References Cited

U.S. PATENT DOCUMENTS

| | | | |
|---|---|---|---|
| 4,313,135 A | | 1/1982 | Cooper |
| 5,600,379 A | | 2/1997 | Wagner |
| 5,703,537 A | | 12/1997 | Bland et al. |
| 5,786,778 A | | 7/1998 | Adams et al. |
| 5,828,678 A | * | 10/1998 | Mock ........................ 714/815 |
| 6,151,076 A | | 11/2000 | Hoffman et al. |
| 6,424,185 B1 | * | 7/2002 | Wolf ........................ 327/107 |
| 7,049,852 B2 | | 5/2006 | Melanson |
| 7,092,476 B1 | | 8/2006 | Melanson |
| 7,158,045 B1 | | 1/2007 | Gudmunson et al. |
| 7,292,832 B2 | * | 11/2007 | Ferguson, Jr. ............... 455/260 |
| 2003/0021370 A1 | * | 1/2003 | Menkhoff ................... 375/355 |

FOREIGN PATENT DOCUMENTS

| | | |
|---|---|---|
| WO | WO9933182 A2 | 7/1999 |
| WO | WO2004088845 A1 | 10/2004 |

OTHER PUBLICATIONS

U.S. Appl. No. 11/232,650, filed Sep. 22, 2005, Melanson.
U.S. Appl. No. 11/082,347, filed Mar. 17, 2005, Gudmunson, et al.
U.S. Appl. No. 11/082,346, filed Mar. 17, 2005, Gudmunson, et al.
U.S. Appl. No. 11/618,784, filed Dec. 30, 2006, Melanson, et al..

* cited by examiner

*Primary Examiner*—Juan A Torres
(74) *Attorney, Agent, or Firm*—Andrew M. Harris; Mitch Harris, Atty at Law, LLC

(57) ABSTRACT

A method and apparatus for generating a clock signal according to an ideal frequency ratio provides flexible and reduced frequency error clock generation. A ratio control number is specified or is determined from a phase-frequency comparison of the clock signal to a timing reference. A correction factor is specified as a numerator and denominator and an error is accumulated according to the numerator and denominator of the correction factor. The ratio control number is adjusted according to the accumulated error so that an ideal ratio is maintained between the frequency of the clock signal and the frequency of the timing reference. If the ratio is determined from a phase-frequency correction, then the phase-frequency error is adjusted so that a loop filter output is corrected on average. Otherwise, the ratio control number is adjusted directly.

21 Claims, 6 Drawing Sheets

METHOD AND APPARATUS FOR GENERATING A CLOCK SIGNAL ACCORDING TO AN IDEAL FREQUENCY RATIO

CROSS-REFERENCE TO RELATED APPLICATIONS

This application is a Continuation-in-Part of U.S. patent application Ser. No. 11/082,347 entitled "METHOD AND SYSTEM FOR VIDEO-SYNCHRONOUS AUDIO CLOCK GENERATION FROM AN ASYNCHRONOUSLY SAMPLED VIDEO SIGNAL", filed on Mar. 17, 2005 and issued as U.S. Pat. No. 7,474,724 on Jan. 6, 2009. The present Application therefore claims priority thereto under 35U.S.C. §120 and incorporates the specification thereof by reference. The above-incorporated parent U.S. Patent Application and the present application claim benefits under 35 U.S.C. §119 (e) from U.S. provisional application Ser. No. 60/618,303, filed Oct. 13, 2004.

This application is related to U.S. patent application Ser. No. 11/614,368, filed on Dec. 21, 2006 entitled "HYBRID ANALOG/DIGITAL PHASE-LOCK LOOP FOR LOW-JITTER SYNCHRONIZATION", Ser. No. 11/618,784, filed on Dec. 30, 2006 entitled "DIRECT DIGITAL SYNTHESIS (DDS) HYBRID PHASE-LOCK LOOP FOR LOW-JITTER SYNCHRONIZATION", and Ser. No. 11/689,729, filed on Mar. 22, 2007 entitled "NUMERICALLY-CONTROLLED PHASE-LOCK LOOP WITH INPUT TIMING REFERENCE-DEPENDENT RATIO ADJUSTMENT", all having at least one common inventor and assigned to the same Assignee. The above-referenced U.S. Patent Applications are incorporated herein by reference.

BACKGROUND OF THE INVENTION

1. Field of the Invention

The present invention relates generally to clock generating circuits, and more specifically, to a method and circuit for generating a clock signal from a reference clock signal in accordance with an ideal frequency ratio.

2. Background of the Invention

Clock generation circuits are used in a wide range of applications in electronic systems. Phase-lock loop (PLL) clock generators are frequently used and have frequencies typically rationally related to a stable clock frequency by using a feedback divider and a pre-scaling divider. With such a scheme, a PLL can generate a frequency that can be greater or less than the stable clock frequency, and with a rational relationship such as $M/N \cdot F_R$ where N is the pre-scaling division factor and M is the feedback divider factor. Such rational frequency multiplying PLLs are frequently used in audio/video (A/V) synchronization circuits, communications circuits and processor clock generation circuits, as well as other applications in which a generated clock signal is required that is synchronized to a timing reference, but the frequency relationship between an available stable clock and the generated clock is not such that simple division can be employed.

Theoretically, any clock frequency can be generated from an arbitrary stable clock frequency and synchronized to a timing reference by such a scheme, as long as the resolution of the pre-scaling divider and feedback divider can be made very large. However, there are practical limitations to using very large dividers. The loop gain of the PLL is inversely proportional to the division factor in the feedback loop, so for large dividers (counters) the loop gain is compromised. Further, for non-terminating rational frequency relationships between the stable clock and the timing reference, increasing the size of the divider chains can reduce the error in the frequency ratio, but never completely eliminate progressive phase differences due to the frequency ratio error. For A/V systems, small errors in a generated synchronization clock can be critical, as relatively long program lengths processed by systems that require relatively high generated clock frequencies lead to phase slip over the length of the program if close tolerances are not held on the generated clock frequency.

For the above reasons, multiple stable clock oscillators are frequently required in A/V synchronization systems, as well as communications systems. Due to differing standards, all required generated clock frequencies that might be supported by a system are not typically related to the stable clock frequency by simple ratios. As an example, the commonly-used 44.1 kilo-samples per second (ksps) CD-Audio rate and its multiple 88.2 ksps do not simply relate to the typical professional audio rates of 32 ksps, 48 ksps, 96 ksps, and 192 ksps. Therefore, typical digital audio systems select between two or more high-frequency stable clock oscillators to generate a clock synchronized to an audio timing reference, depending on whether the data source and timing reference are synchronized to a multiple of 44.1 ksps or 16 ksps.

Further, in some systems, it is desirable to generate a clock signal from another clock signal according to a rational relationship, but without synchronizing the clock signal to a timing reference. For example, in the above-described audio systems, when a timing reference is not present, it is still generally desirable to generate a clock according to a rational relationship to the stable clock. Therefore, in audio systems that still require generation of, for example, 44.1 ksps-based clock rates vs. 16 ksps-based clock rates, two oscillators are still required. For example, when supporting sampling of an analog audio source with no external timing reference, the sampling device must generally provide a sampling clock generated in conformity with a multiple of one of 44.1 ksps and 16 ksps.

Therefore, it would be desirable to provide a method and circuit for maintaining an ideal ratio between a rationally controlled frequency source and a timing reference so a stable clock can be produced with a more exact frequency relationship between the stable clock and a generated clock that is synchronized to a timing reference. It would further be desirable to generate a clock signal that is rationally related by an ideal ratio from a stable clock signal without synchronization to a timing reference other than the stable clock signal itself.

SUMMARY OF THE INVENTION

The above stated objectives are achieved in a method and circuit for generating a clock signal from a stable clock signal according to an ideal ratiometric relationship.

An output clock signal is generated from a ratio control number representing a ratio between a frequency of a stable clock and a desired clock frequency of the output clock signal. A rational frequency correction circuit adjusts said ratio control number according to an accumulated error. The error is accumulated according to a correction numerator and denominator that provide a fine adjustment to the average frequency of the clock output so that an ideal ratio can be maintained between the frequency of the output clock signal and the frequency of a timing reference.

The timing reference may be the stable clock and the accumulated error used to adjust the least significant bit(s) of the ratio control number.

Alternatively, the timing reference may be a timing reference other than the stable clock, with a phase-frequency comparator and loop filter included to obtain the ratio control number in a phase-lock loop arrangement. The accumulated error is then used to adjust the phase-frequency error of the phase-frequency comparator so that the ratio control number is adjusted at the output of the loop filter as a result.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses ratiometric clock generating circuits and methods of operation for generating a clock output from a timing reference. The clock output is generated by a numerically controlled oscillator (NCO) circuit having a frequency controlled by a ratio control number. A ratio correction factor is specified as a numerator and denominator and represents an adjustment that corrects for the finite value of the ratio control number. An error is accumulated at periodic intervals, such as the rate of a stable clock that operates the NCO circuit, in accordance with the correction numerator and denominator. If the circuit is not providing a clock output phase-locked to another timing reference, then the ratio control number least significant bit(s) is adjusted in accordance with the level of accumulated error. If the clock output is generated in phase-lock with another timing reference, then the adjustment is applied to the phase-frequency error and is thereby filtered by the loop filter to provide a resultant adjustment at the ratio control number output of the loop filter.

Figure 1:
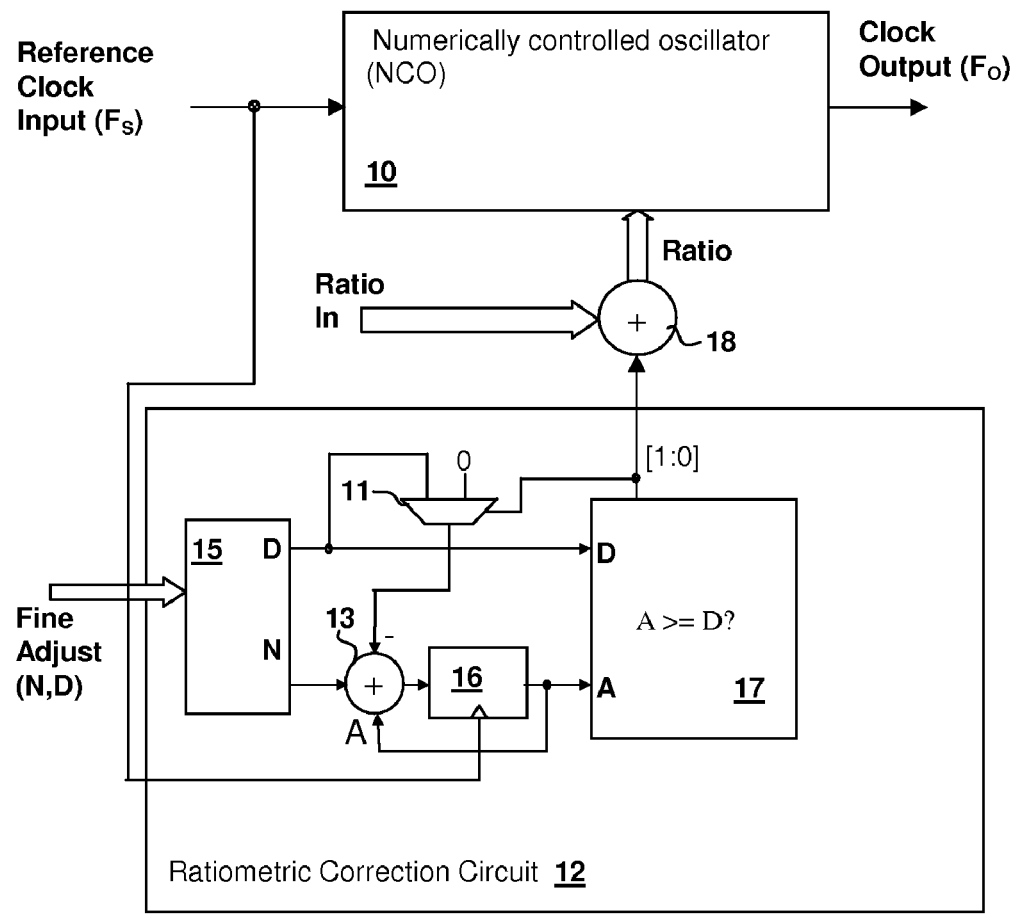
FIG. 1 is a block diagram depicting a clock generating circuit in accordance with an embodiment of the present invention.

Referring now to FIG. 1, an exemplary clock generating circuit in accordance with an embodiment of the invention is shown. In the depicted embodiment, a timing reference is provided by a Reference Clock Input signal having frequency $F_S$, and NCO 10 generates a Clock Output signal in accordance with a specified frequency ratio control number Ratio. A number Ratio In is provided to a combiner 18 that has an output providing ratio control number Ratio to the frequency control input of NCO 10. A fine adjustment value Fine Adjust (N,D) provides a correction factor as a correction numerator N and correction denominator D that allow the frequency of the Clock Output signal to be more precisely controlled than is possible with the finite word length of the Ratio control number. For example, in a circuit having a Reference Clock Input signal frequency $F_S$=27.000 MHz and an audio clock of 128*44,100 Hz is required, the actual ratio is 392/1875. As a fraction of a 16-bit number representing a ratio of one as full-scale, ratio control number Ratio is equal to 13701, but has an error of approximately 0.4LSB or −2.808 ppm. If the correction factor is supplied as 737/1875, where the correction numerator N is 737 and the correction denominator D is 1875, then the error is zero. The zero-error operation is accomplished by using 13701 as the NCO control ratio 1875−737=1138 times and using 13702 as the NCO control ration 737 times for every 1875 ratio update periods. Because the difference in frequency for a ratio of 13702 vs. 13701 is small, substantially no signal output distortion will occur when the Clock Output is used as, for example, an oversampled audio data clock.

Thus, the depicted circuit provides a solution that accepts a timing reference, a ratio control integer Ratio In, and a correction factor specified as a numerator N and denominator D and will generate a clock signal having the exact frequency relationship desired between the clock output signal frequency and the frequency of a timing reference, as long as that relationship is rational and repeating within the limits of the resolution of numerator N and denominator D. In general, even with a short binary expression for numerator N and D, the frequency ratio can be specified within the tolerance of clock frequencies and clock frequency drift possible with present-technology frequency sources.

A ratiometric correction circuit 12 accepts the Fine Adjust values that specify correction numerator N and correction denominator D and produce an accumulated error A that is compared to correction denominator D by comparison circuit 17 to generate an adjustment output. In the depicted embodiment, the adjustment output is a single logical value [0:1] that causes a value of "1" to be added to ratio control integer Ratio In when accumulated error A is greater than correction denominator D. A combiner 13 subtracts a value selected by selector 11, which is either correction denominator D or zero in accordance with the output of comparison circuit 17, so that when accumulated error A exceeds the value of correction denominator D, accumulated error A is effectively reset. Combiner 13 also adds the value of correction numerator N at each error update period, which in the depicted embodiment, is every period of the Reference Clock Input signal that clocks a latch 16 that provides storage for accumulated error A. Correction numerator N and correction denominator D are provided from a register 15, which may either be a latch for storing externally provided values of correction numerator N and correction denominator D, thus implementing a programmable correction set by values provided as the Fine Adjust inputs, or may be selected from fixed values stored in an array that are selected in response to selection signals provided as the Fine Adjust inputs.

Figure 2:
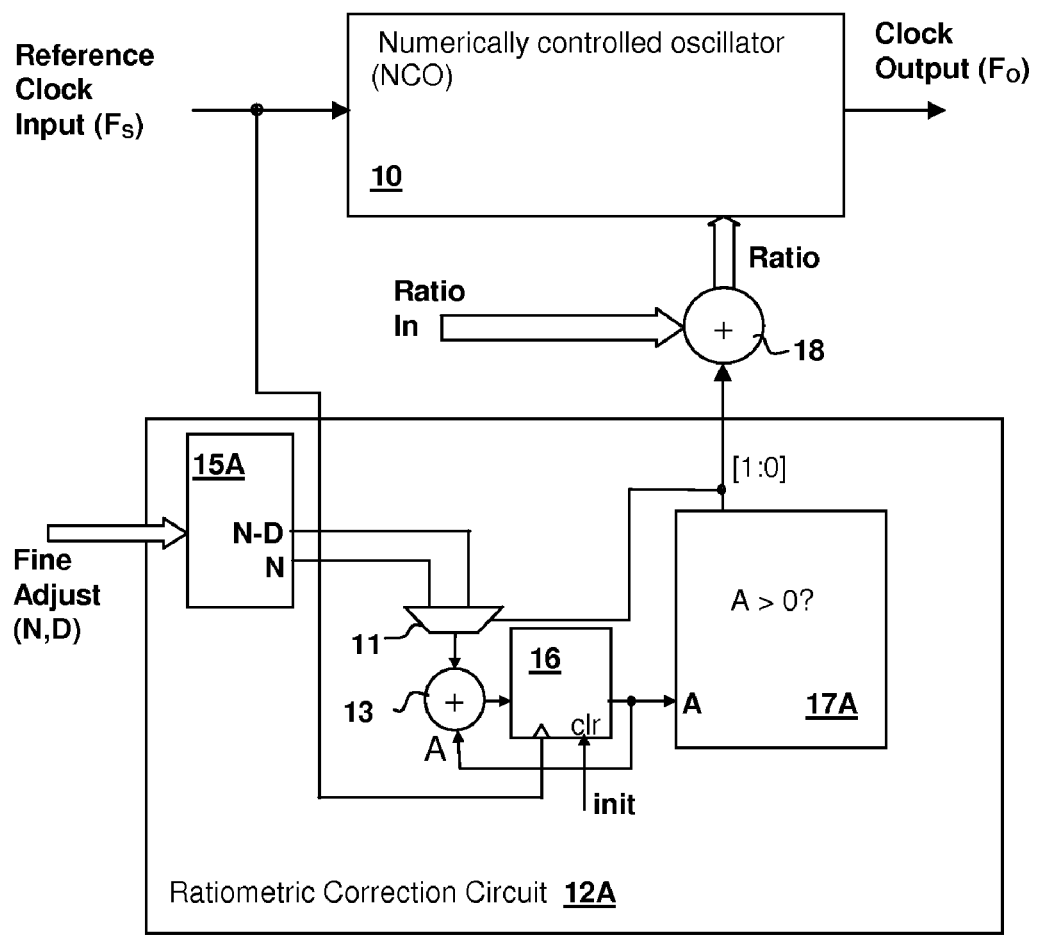
FIG. 2 is a block diagram depicting a clock generating circuit in accordance with another embodiment of the present invention.

Referring now to FIG. 2, an alternative exemplary ratiometric correction circuit 12A in accordance with another embodiment of the invention is shown, as may be used to implement ratiometric correction circuit 12 of FIG. 1. Ratiometric correction circuit 12A operates in a manner similar to ratiometric correction circuit 12 illustrated in FIG. 1, and therefore only differences in operation between ratiometric correction circuits 12 and 12A are described below. Ratiometric correction circuit 12A eliminates the need for a 3-input adder by using a (negative) value of N−D and alternatively selecting value N−D or correction numerator N via selector 11, according to whether the accumulated error A is greater than zero as determined by a comparison circuit 17A. Accumulated error A is initialized to zero by an initialization signal init when the circuit is started or reset. If accumulated error A is greater than zero as determined by a comparison circuit 17A, a value of "1" is added to ratio control integer Ratio In, as in ratiometric correction circuit 12. The selected value N–D or correction numerator N from selector 11 is added to the accumulated error at each cycle. Value N–D is provided from register 15A, and may be supplied as a programmed value or computed via combinational logic in register 15A. Since value N–D is negative and is added each time that accumulated error A is greater than zero, accumulated error A is maintained below zero except for the cycles in which ratio control integer Ratio In is raised by a value of one, which will occur at the same frequency as the overflow of accumulated correction numerator values exceeding the correction denominator value D in the ratiometric correction circuit 12 illustrated in FIG. 1, and the resultant frequency correction will be the same.

Figure 3:
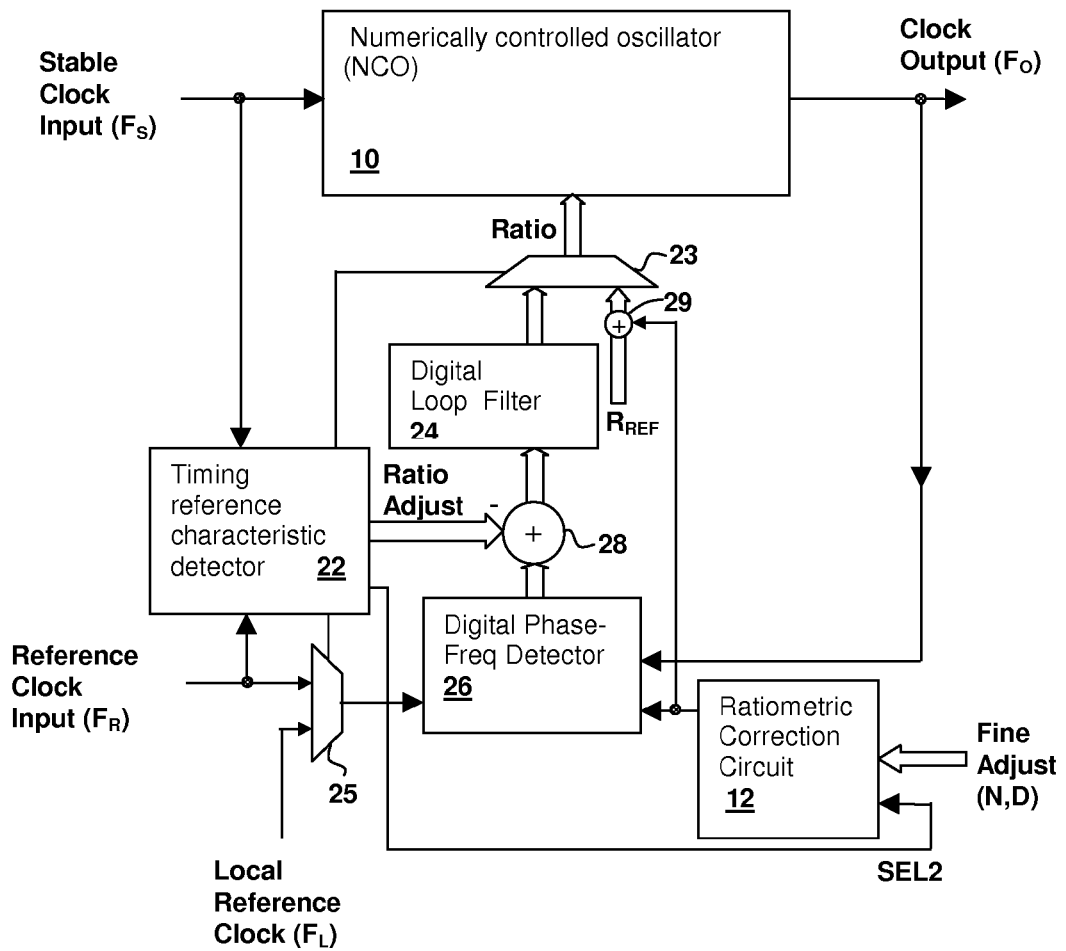
FIG. 3 is a block diagram depicting a clock generating circuit in accordance with still another embodiment of the present invention.

Referring now to FIG. 3, an exemplary clock generating circuit in accordance with another embodiment of the invention is shown. The depicted circuit is a phase-lock loop circuit that generates a low-jitter Clock Output signal that is synchronized to a Reference Clock Input signal. The Clock Output signal is generated by numerically controlled oscillator 10, again in response to a control number Ratio, which represents a rational relationship between the frequency ($F_O$) of the Clock Output signal and that of a Stable Clock Input signal ($F_S$), which is provided to numerically controlled oscillator (NCO) 10 as a reference clock. The control number Ratio is updated from an output of a digital loop filter 24 that filters the output of a digital phase-frequency detector 26. Digital phase-frequency detector 26 compares the frequency and phase of the Clock Output signal with a timing reference selected by a selector 25, which generally applies the Reference Clock signal to the input of digital phase-frequency detector 26, but depending on the suitability and presence of the Reference Clock signal, selector 25 may alternatively select a Local Reference Clock signal, which is generally an oscillator within the circuit as opposed to an externally supplied reference, to provide the timing reference. Another selector 23 may be activated if the Reference Clock signal is absent or unsuitable, and selects a ratio $R_{REF}$ to provide a fixed frequency output from NCO 10.

A timing reference characteristic detector 22 can be optionally provided to detect one or more characteristics of the Reference Clock signal, including detecting absence of the Reference Clock signal, such as occurs when an external audio/video synchronization or data signal is not supplied to the Reference Clock Input. Timing reference characteristic detector 22 also detects the frequency range of the signal supplied to the Reference Clock Input. The detected frequency range is then used to adjust the ratio controlling NCO 10, so that the loop bandwidth of the PLL circuit can be minimized, while handling a wide range of input frequencies. Additional benefits include a reduction of the required numeric range of digital loop filter 24, reduction of the required dynamic range in digital phase/frequency detector 26 and reduced disruption of PLL operation when changes in frequency of the Reference Clock Input signal occur. In particular, when the possible frequencies of the Reference Clock Input signal are related as integer multiples and the Ratio Adjust number is provided accordingly, loop disruption on changes of Reference Clock Input signal frequency is minimized. Also, the output of digital phase/frequency detector 26 need only provide a fine adjustment to the resulting number Ratio when the Ratio Adjust number provides the most-significant portion of the number Ratio, as combined with the output of digital phase/frequency detector 26 by a combiner 28.

Ratiometric correction circuit 12 is also included in the circuit of FIG. 3 and is implemented as illustrated in either of FIG. 1 or FIG. 2. However, the application of the output correction bit(s) is changed for the phase-lock loop implementation. If selector 23 applies the output of digital loop filter 24 to close the phase-lock loop, the correction provided by ratiometric correction circuit 12 is introduced at digital phase-frequency detector 26 to adjust the value of the phase-frequency error and the resultant change in the Ratio number appears after the corrected phase-frequency error is filtered by digital loop filter 24. If selector 23 applies ratio $R_{REF}$ to provide a fixed frequency output from NCO 10, the correction is applied by a combiner 29 to directly correct the ratio control number Ratio as in the circuit of FIG. 1. Further, if timing reference characteristic detector 22 is included in the circuit, a selection signal SEL2 can be provided to select from among a number of sets of correction numerator N and correction denominator D values, or may be set to disable the correction provided by ratiometric correction circuit 12 for certain timing reference types or frequency ranges.

Figure 4:
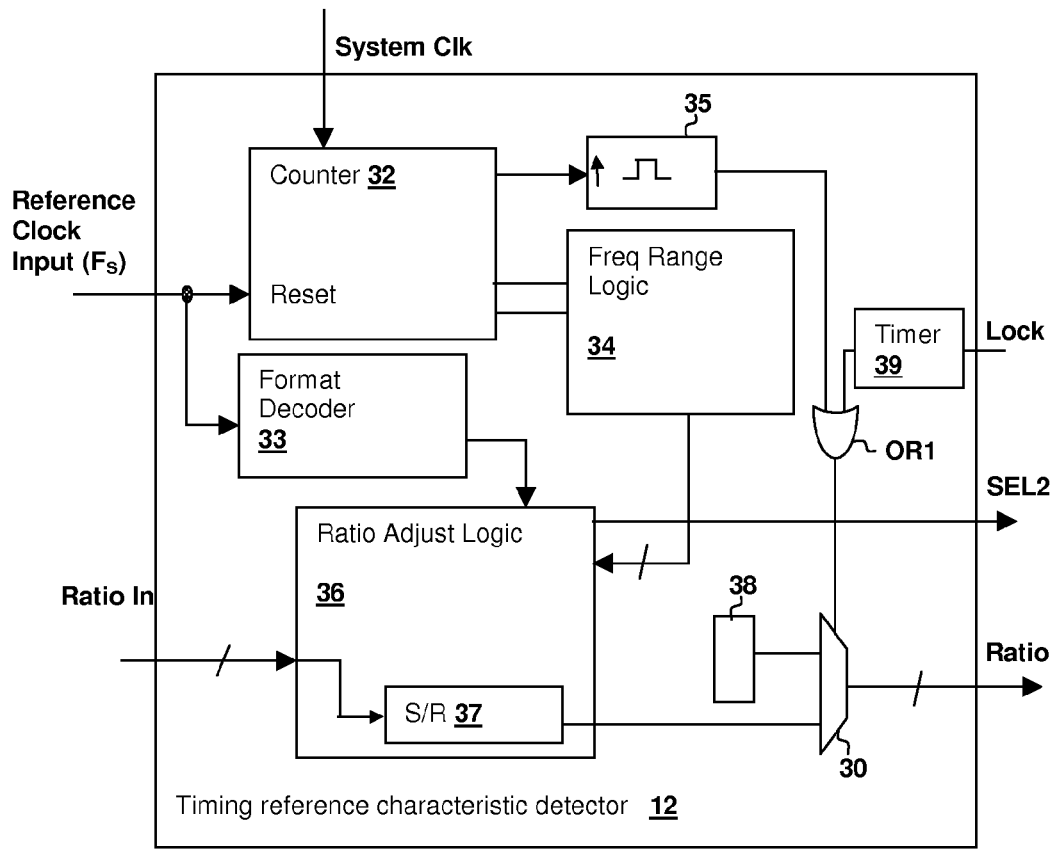
FIG. 4 is a block diagram depicting details of timing reference characteristic detector circuit 12 of FIG. 1, FIG. 2, and FIG. 3.

Referring now to FIG. 4, details of optional timing reference characteristic detector 22 are shown, in accordance with an embodiment of the invention. A counter 32 is clocked by a System Clk clock signal, which may be the Stable Clock signal or another available clock signal. Counter 32 operates as a frequency counter, providing one or more bit outputs to a frequency range logic 34 that provide inputs to a ratio adjust logic block 36. Depending on the frequency range of the signal applied to the Reference Clock Input, ratio adjust logic 36 alters the number Ratio In to provide output number Ratio, by shifting the Ratio In number in a shift register 37, by combinatorial logic or other logic operations. A format decoder 33 is used to determine a data or signal type of a signal applied to the Reference Clock Input, and provides an output to ratio adjust logic 36 to further direct ratio adjust logic 36 to adjust ratio Ratio In. For example, if desired Clock Output frequency $F_O$ is a PCM bit rate (data length×word clock rate) and if the Reference Clock Input receives a word clock, the average Ratio value should be data length×$F_O/F_S$. However, if the Reference Clock Input receives a LR clock (left/right clock) for a stereo signal, then the Ratio value should be adjusted to an average value of 2×data length×$F_O/F_S$, to compensate for the 2:1 frequency relationship between the word clock and the LR clock.

A clock presence detector is provided by a retriggerable one-shot circuit 35, which may be an analog circuit, or may be a digital circuit clocked by the System Clk signal or other clock signal. The output of retriggerable one-shot circuit 35 is optionally combined with the output of a timer 39 that measures when a Lock input signal provided by the output of digital loop filter 24 of FIG. 3 has remained de-asserted for a predetermined period of time. The Lock input signal can be used to indicate that the Reference Clock Input signal is degraded. The output of logical OR-gate OR1 combines the output of timer 39 with the output of retriggerable one-shot circuit 35 to provide a control signal that operates a selector 30 that selects between the output of ratio adjust logic 36 and the output of a register 38 that holds a fixed ratio value. Ratio adjust logic 36 also provides the SEL2 selection signal, which may be derived in accordance with timing reference type as determined by format decoder 33 and/or a frequency range as determined by frequency range logic 34 to select between correction numerator N and correction denominator D values stored in register 15 of ratiometric correction circuit 12.

Figure 5:
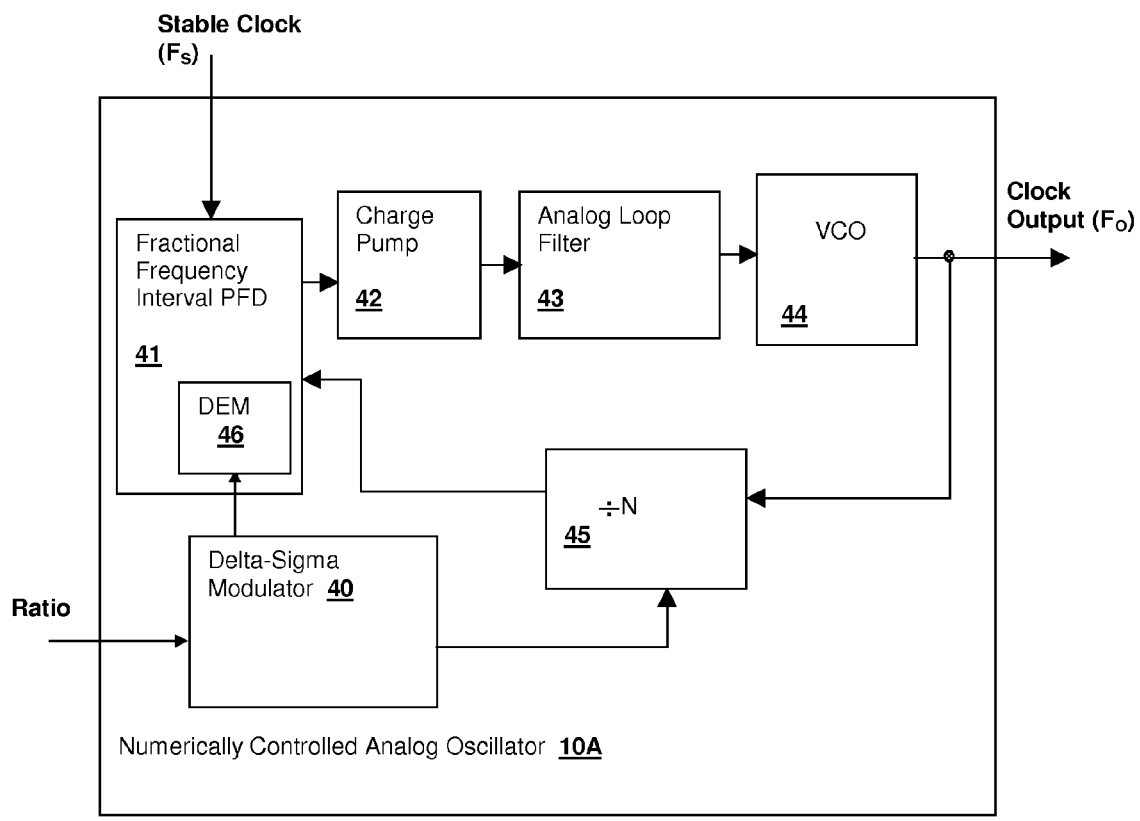
FIG. 5 is a block diagram depicting details of a fractional-N oscillator circuit 10A that may be used to implement numerically controlled oscillator 10 in the circuits of FIG. 1, FIG. 2, and FIG. 3.

Referring now to FIG. 5, an exemplary NCO circuit 10A that can be utilized to implement NCO 10 in the circuits of FIG. 1 and FIG. 3 is shown. The depicted "fractional-N" oscillator circuit is disclosed in detail in U.S. Pat. No. 7,049,852, entitled "FRACTIONAL-INTEGER PHASE-LOCKED LOOP SYSTEM WITH A FRACTIONAL-FREQUENCY-INTERVAL PHASE FREQUENCY DETECTOR", issued to John L. Melanson on May 23, 2006, which is incorporated herein by reference. Furthermore, FIG. 1 of the above-incorporated U.S. Patent discloses another numerically-controlled analog oscillator that may be alternatively used to implement NCO 10 in the circuits of FIG. 1 and FIG. 2 if the wider-bandwidth and otherwise higher performance of the circuit depicted in FIG. 5 is not required for a given application. The circuit of FIG. 5 provides a low-jitter Clock Output signal that is determined by an input Ratio number and the frequency of the Stable Clock signal.

The Clock Output signal is provided from a voltage-controlled analog oscillator (VCO) 44 that receives a frequency control voltage from an analog loop filter 43. A fractional frequency interval phase-frequency detector (PFD) 41 provides a correction signal to charge pump 42, which is then filtered by analog loop filter 43 to generate the frequency control voltage. Fractional frequency interval PFD 41 compares the frequency and phase of the Stable Clock signal to the output of a divider 45 that divides the Clock Output signal by an integer value N. A delta-sigma modulator 40 varies the integer division value according to the Ratio value and the noise shaping transfer function of delta-sigma modulator 40 so that the average frequency at the output of divider 45 is equal to the frequency $F_S$ of the Stable Clock signal. A dynamic element matching block (DEM) 46 in fractional frequency interval PFD 41 receives the modulator feedback signal from delta-sigma modulator 40. The DEM 46 provides for matching of individual elements in fractional frequency interval PFD 41, which actually comprises multiple parallel phase-frequency detectors having inputs provided from a selection between the output of divider 45 and a delayed version of the output of divider 45, as described in further detail in the above-incorporated U.S. Patent.

Figure 6:
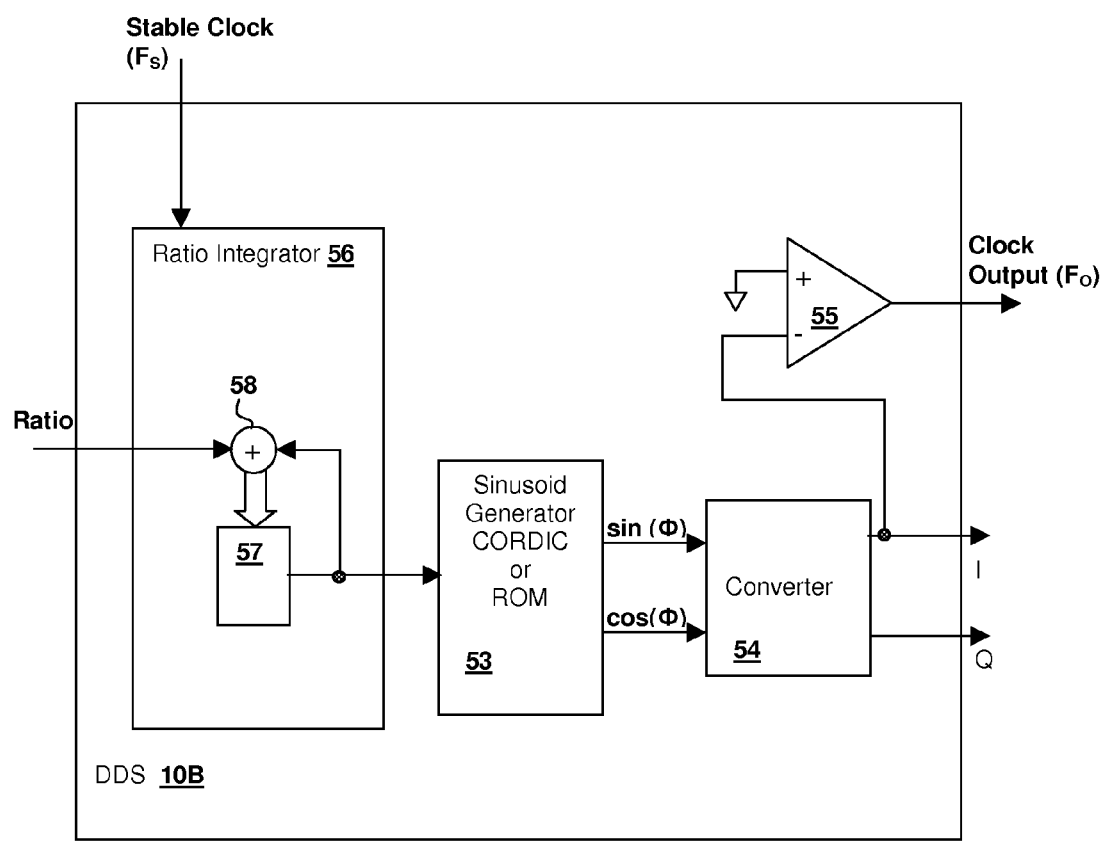
FIG. 6 is a block diagram depicting details of a direct digital synthesis (DDS) circuit 10B that may be used to implement numerically controlled oscillator 10 in the circuits of FIG. 1, FIG. 2, and FIG. 3.

Referring now to FIG. 6, an alternative exemplary direct digital synthesis (DDS) circuit 10B that can be used to implement NCO 10 in the circuits of FIG. 1 and FIG. 3 is shown. The circuit of FIG. 6 provides a low-jitter Clock Output signal that has a frequency determined by an input Ratio number and the frequency of the Stable Clock signal. A ratio integrator 56 formed by a latch 57 and adder 58 integrates the Ratio number to provide an on-going phase number that is used by sinusoid generating circuit 53 to provide values corresponding to sinusoidal waveshapes ($e^{j\Phi}$), so that as the output phase $\Phi$ from ratio integrator 56 progresses, values corresponding to sin($\Phi$) and cos($\Phi$) are provided from sinusoid generating circuit 53 to a converter circuit 54 that provides sinusoidal analog signals I and Q at frequency $F_O$. As mentioned above, the I and Q signals may be further frequency-multiplied by a complex PLL to obtain a higher frequency output clock and/or converted to digital form via a comparator 55 or other suitable analog-to-digital converter to provide a digital Clock Output signal. Sinusoid generating circuit 53 either calculates sinusoidal representation values via a CORDIC algorithm or indexes a read-only memory (ROM) using the input phase information. Use of a CORDIC algorithm processing block provides a compact implementation, as the ROM size required for look-up table implementation increases exponentially with an increase in the resolution of the phase value used as a look-up address.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A circuit for providing a clock output, comprising:
   a numerically-controlled oscillator for providing said clock output having an output frequency determined by a ratio control number representing a ratio between a frequency of said clock output and a frequency of a stable clock; and
   a ratiometric correction circuit for adjusting said ratio control number according to an accumulated error of said ratio computed from a specified correction numerator and a correction denominator, whereby a frequency error of said clock output due to a finite expression of said ratio control number is corrected such that a long-term average of said ratio of said frequency of said clock output to a frequency of a timing reference is maintained at a value equal to an ideal frequency ratio.

2. The circuit of claim 1, wherein said timing reference is said stable clock.

3. The circuit of claim 1, wherein said ratiometric correction circuit accumulates said accumulated error at each cycle of said stable clock.

4. The circuit of claim 1, wherein said ratiometric correction circuit adjusts a least significant bit of said ratio control number.

5. The circuit of claim 1, wherein said ratiometric correction circuit comprises:
   a register for storing said accumulated error;
   a comparison circuit for comparing said accumulated error to said correction denominator, and wherein said comparison circuit adjusts said ratio control number upward if said accumulated error is greater than or equal to said correction denominator; and
   a combiner for adding said correction numerator to said accumulated error and subtracting a said correction denominator from said accumulated error when said comparison circuit indicates that said accumulated error is greater than or equal to said correction denominator.

6. The circuit of claim 1, further comprising:
   a digital phase-frequency detector for generating a representation of an on-going phase-frequency difference between said timing reference and a signal derived from said clock output; and
   a digital loop filter for filtering said representation of said on-going phase-frequency difference to provide said ratio control number to said numerically-controlled oscillator, and wherein said ratiometric correction circuit is coupled to an input of said digital phase frequency detector for adjusting said on-going phase-frequency difference according to said accumulated error, whereby said ratio control number is adjusted at an output of said digital loop filter.

7. The circuit of claim 6, wherein said timing reference is a signal supplied at a timing reference input.

8. The circuit of claim 7, further comprising:
   a timing reference characteristic detection circuit for detecting a characteristic of a timing reference signal supplied to said timing reference input; and a ratio adjustment circuit for adjusting said rational numeric representation in conformity with said detected characteristic.

9. The circuit of claim 8, wherein said ratiometric correction circuit is coupled to an output of said ratio adjustment circuit for adjusting at least one of said correction numerator and said correction denominator in conformity with said detected characteristic.

10. The circuit of claim 6, wherein said timing reference is a secondary local reference clock signal.

11. A method of generating a clock output having an ideal ratiometric relationship to a timing reference, said method comprising:
generating a clock output from a numerically-controlled oscillator ratiometrically locked to a stable clock source, wherein a frequency of said clock output is controlled by a rational numeric representation of a ratio between a frequency of said clock output and a frequency of said stable clock; and
adjusting said rational numeric representation according to an accumulated error of said ratio computed from a specified correction numerator and a correction denominator, whereby a frequency error of said clock output due to a finite expression of said ratio control number is corrected such that a long-term average of said ratio of said frequency of said clock output to a frequency of a timing reference is maintained at a value equal to an ideal frequency ratio.

12. The method of claim 11, further comprising providing said stable clock as said timing reference.

13. The method of claim 11, further comprising accumulating said accumulated error at each cycle of said stable clock.

14. The method of claim 11, wherein said adjusting adjusts a least significant bit of said rational numeric representation.

15. The method of claim 11, further comprising:
adding said correction numerator to said accumulated error;
determining whether said accumulated error is greater than or equal to said correction denominator;
responsive to determining that said accumulated error is greater than or equal to said correction denominator, adjusting said ratio control number upward and subtracting said correction denominator from said accumulated error; and
storing said accumulated error.

16. The method of claim 11, further comprising:
generating a representation of an on-going phase-frequency difference between said timing reference and a signal derived from said clock output; and
filtering said representation of said on-going phase-frequency difference with a digital filter to provide said rational numeric representation to said numerically-controlled analog oscillator.

17. The method of claim 16, further comprising:
detecting a characteristic of said timing reference; and
adjusting said rational numeric representation in conformity with said detected characteristic.

18. The method of claim 17, further comprising adjusting at least one of said correction numerator and said correction denominator in conformity with said detected characteristic.

19. An integrated circuit, comprising:
an input for receiving a timing reference;
an output for providing a clock output; and
at least one digital input for receiving information specifying a ratio control number, a correction numerator and a correction denominator, wherein said integrated circuit generates said clock output having an average frequency proportional to a frequency of said timing reference, wherein said proportionality is equal to said ratio control number plus a ratio of said correction numerator to said correction denominator.

20. The integrated circuit of claim 19, further comprising:
a numerically-controlled oscillator for providing said clock output and having an input for receiving said specified ratio control number; and
a ratiometric correction circuit for adjusting said ratio control number according to an accumulated error of said ratio computed from said specified correction numerator and said specified correction denominator, whereby a frequency error of said clock output due to a finite expression of said ratio control number is corrected such that a long-term average of said ratio of said frequency of said clock output to a frequency of said timing reference is maintained at a value equal to an ideal frequency ratio.

21. The integrated circuit of claim 20, further comprising:
an input for receiving a stable clock input, and wherein said ratio control number specifies a ratio between said frequency of said clock output and said frequency of said stable clock;
a digital phase-frequency detector for generating a representation of an on-going phase-frequency difference between said timing reference and a signal derived from said clock output; and
a digital loop filter for filtering said representation of said on-going phase-frequency difference to provide said ratio control number to said numerically-controlled oscillator, and wherein said ratiometric correction circuit is coupled to an input of said digital phase frequency detector for adjusting said on-going phase-frequency difference according to said accumulated error, whereby said ratio control number is adjusted at an output of said digital loop filter.

* * * * *